United States Patent
Higuchi et al.

[11] Patent Number: 6,049,111
[45] Date of Patent: *Apr. 11, 2000

[54] SEMICONDUCTOR DEVICE INCLUDING PROTECTIVE CIRCUIT WITH GUARD RING

[75] Inventors: Tsutomu Higuchi; Hitoshi Yamada, both of Tokyo, Japan

[73] Assignee: Oki Electric Industry Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/012,971

[22] Filed: Jan. 26, 1998

[30] Foreign Application Priority Data

Jun. 30, 1997 [JP] Japan ................................. 9-190416

[51] Int. Cl.[7] .......................... H01L 23/62; H01L 29/74; H01L 31/111
[52] U.S. Cl. .......................... 257/355; 257/356; 257/358; 257/173
[58] Field of Search .................................. 257/484, 355, 257/356, 358, 542, 173

[56] References Cited

U.S. PATENT DOCUMENTS

| | | | |
|---|---|---|---|
| 5,159,518 | 10/1992 | Roy | 257/357 |
| 5,166,089 | 11/1992 | Chen et al. | 257/355 |
| 5,430,595 | 7/1995 | Wagner et al. | 257/355 |
| 5,491,358 | 2/1996 | Miyata | 257/355 |
| 5,581,103 | 12/1996 | Mizukami | 257/355 |

FOREIGN PATENT DOCUMENTS

| | | |
|---|---|---|
| 5-160349 | 6/1993 | Japan . |
| 6-62529 | 4/1994 | Japan . |
| 8-306872 | 11/1996 | Japan . |

*Primary Examiner*—Mahshid Saadat
*Assistant Examiner*—Jess A. Fenty
*Attorney, Agent, or Firm*—Jones Volentine, L.L.P.

[57] ABSTRACT

A semiconductor device includes a protection circuit and a guard ring. The guard ring is formed between a MOS transistor of a semiconductor substrate and internal circuits, to cut off a leak current from the MOS transistor to the internal circuits. The guard ring includes a well region and a pair of heavily doped impurity regions for med spaced apart from each other on the surface of the well region. The pair of doped regions have mutually different conductivity types and have substantially equal voltages applied to have potentials with respect to the source of the MOS transistor. There are formed a first parasitic transistor having one heavily doped impurity region as the collector, the semiconductor substrate as the base, and the drain of the MOS transistor as the emitter, the one heavily doped impurity region being identical in conductivity type with the well region; and a second parasitic transistor having the other heavily doped impurity region as the emitter, the well region as the base, and the semiconductor substrate as the collector. When the first parasitic transistor conducts, the second parasitic transistor conducts, which turns off the first parasitic transistor. Thus, the leak current is prevented from flowing from the MOS transistor through the first parasitic transistor to the internal circuits.

6 Claims, 3 Drawing Sheets

SEMICONDUCTOR DEVICE INCLUDING PROTECTIVE CIRCUIT WITH GUARD RING

BACKGROUND OF THE INVENTION

1. Field of the Invention

The present invention relates to a semiconductor device, such as a semiconductor integrated circuit, and more particularly to a semiconductor device including a protective circuit for protecting internal circuits of the semiconductor substrate from an overcurrent, such as a surge current, and a guard ring to prevent the deterioration of the dielectric strength due to a leak current which occurs in relation to the protection circuit.

2. Prior Art

In a semiconductor integrated circuit having an integrated circuit fabricated in the semiconductor substrate, when an overvoltage caused by static electricity or the like is applied to the input pad of the internal circuits and, therefore, a surge current flows into the internal circuits connected to the input pad, the internal circuits are damaged.

To prevent the internal circuits from being damaged by a surge current, a bypass to inhibit an excessive surge current from being input into the internal circuits is formed by using a MOS transistor having a source and a drain formed in the semiconductor substrate.

This MOS transistor cuts off the bypass by blocking the channel between the source and the drain to an ordinary current, but makes the bypass conductible by establishing the channel to an excessive current, such as a surge current to thereby preventing the excessive current from flowing into the internal circuits.

With semiconductor devices having a MOS transistor just described as the protection circuit, if part of the carriers produced between the source and the drain of the MOS transistor flows to other circuit portions in the vicinity of the protection circuit, there is a possibility that the dielectric strength of the semiconductor device deteriorates.

To prevent the carriers which leak from the protection circuit formed of a MOS transistor from moving to the other circuit portions in the surrounding area of the protection circuit, a guard ring, including a well region which absorbs the carriers leaking from the protection circuit, is formed between the protection circuit and the other circuit portions in the vicinity of the protection circuit.

In the guard ring, when the substrate is of p-type conductivity, for example, the well region is formed by converting that region of the substrate to n-type conductivity, and the well region is connected through a heavy n+ doped region to the power supply line. When the semiconductor substrate is of p-type conductivity, an n-channel MOS transistor is used for the MOS transistor of the protection circuit.

By this guard ring, the part of carriers produced between the source and the drain of the n-channel MOS transistor of the protection circuit are absorbed through the n-well region by the positive potential of the power supply applied to the heavily doped n+ region, so that the deterioration of the dielectric strength caused by the carriers can be prevented.

Meanwhile, in the guard ring of the prior art, the heavily doped n+ region in the well, the p-type semiconductor substrate, and the drain, made of an n-type impurity region, of the MOS transistor constitute a parasitic NPN transistor as those regions respectively serve as the collector, the base, and the emitter.

In this parasitic transistor, when a voltage lower than the potential of the semiconductor substrate is applied to the input pad, the drain potential working as its emitter potential becomes higher than the substrate potential working as its base potential, with the result that the parasitic transistor conducts. Under the condition that this parasitic transistor is conducting, the other parasitic NPN transistors, which are outside the guard ring and equivalent to that parasitic transistor using the drain as its emitter, conduct.

The conduction of those parasitic transistors causes various problems in the circuit operation.

The object of the present invention is to provide a new technique to inhibit the conduction of the parasitic transistors of the semiconductor device, including a protection circuit to protect the internal circuits against an overcurrent, and a guard ring designed to prevent the deterioration of the dielectric strength by a leak current which occurs in conjunction with the protection circuit.

SUMMARY OF THE INVENTION

To solve the above problem, the present invention has been made to provide a semiconductor device comprising:

a semiconductor substrate of either an n-type or a p-type conductivity having formed therein an internal circuit which receives an input signal through an input pad;

a protection circuit including a MOS transistor having a source and a drain and formed in the semiconductor substrate to protect the internal circuit from a surge current applied to the input pad; and a guard ring formed between the MOS transistor of the semiconductor substrate and the internal circuit to cut off a leak current from the MOS transistor to the internal circuit, the guard ring including a well region having a conductivity type opposite to the conductivity type of the semiconductor substrate, wherein a pair of heavily doped impurity regions formed spaced apart from each other on the surface of the well region, having mutually different conductivity types, and having substantially equal voltages applied to have potentials with respect to the source of the MOS transistor, and wherein there are formed a first parasitic transistor having one of the heavily doped impurity regions as the collector, the semiconductor substrate as the base, and the drain region of the MOS transistor as the emitter, the one heavily doped impurity region being identical in conductivity type with the well region and located in the well region;

and a second parasitic transistor having the other heavily impurity doped region in the well region as the emitter, the well region as the base, and the semiconductor substrate as the collector.

In the semiconductor device according to the present invention, when the first parasitic transistor is made to conduct, in other words, when a surge current is input to the input pad and therefore the drain potential of the MOS transistor is lower than the potential of the semiconductor device, the first parasitic transistor relying on the drain potential of the MOS transistor for the emitter potential and also depending on the semiconductor substrate potential for the base potential conducts, and the other equivalent parasitic transistors formed in parallel with the first parasitic transistor outside the guard ring conduct, too.

As the first parasitic transistor conducts and a current flows from the collector to the base thereof, a parasitic resistance to this current is produced in the well. Due to the voltage drop at this resistance, the base potential drops with respect to the emitter potential of the second parasitic transistor. By this drop of the base potential, the second parasitic transistor conducts.

By the conduction of the second parasitic transistor, a current flows through the semiconductor substrate to the drain so that the potential of the drain rises with respect to the ground potential of the semiconductor substrate.

Therefore, by the conduction of the second parasitic transistor, a change of the drain voltage of the MOS transistor, which is the cause of the conduction of the first parasitic transistor and the other equivalent parasitic transistors, can be corrected, the base currents of the first parasitic transistor and other equivalent parasitic transistors decrease, and those parasitic transistors are thereby turned off.

Consequently, various impediments can be removed which occur due to the conduction of the parasitic transistors in the semiconductor device, which includes a protection circuit to protect the internal circuits against an overcurrent; and a guard ring to prevent the deterioration of the dielectric strength by the leak current produced in conjunction with the protection circuit.

Of a pair of heavily doped impurity regions of the guard ring, a heavily impurity doped regions opposite in conductivity type to the drain of the MOS transistor of the protection circuit is preferably arranged closer to the drain than the heavily impurity doped region of the opposite conductivity type.

Under this arrangement, when the second parasitic transistor conducts, a current flows through the semiconductor substrate to the drain to quickly correct the drain potential of the MOS transistor, and therefore the first parasitic transistor and the other equivalent parasitic transistors can be turned off quickly and effectively.

To cause the second parasitic transistor to quickly conduct by the conduction of the first parasitic transistor, a resistance is preferably inserted in the power supply line connected to one heavily doped impurity region, which works as the collector of the first parasitic transistor, of a pair of the heavily impurity doped regions.

By the insertion of this resistance, when the first parasitic transistor conducts, the base potential to cause the second parasitic transistor to conduct can be provided surely, so that the turning off of the first parasitic transistor and the other equivalent parasitic transistors by the conduction of the second parasitic transistor can be executed with improved steadiness.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
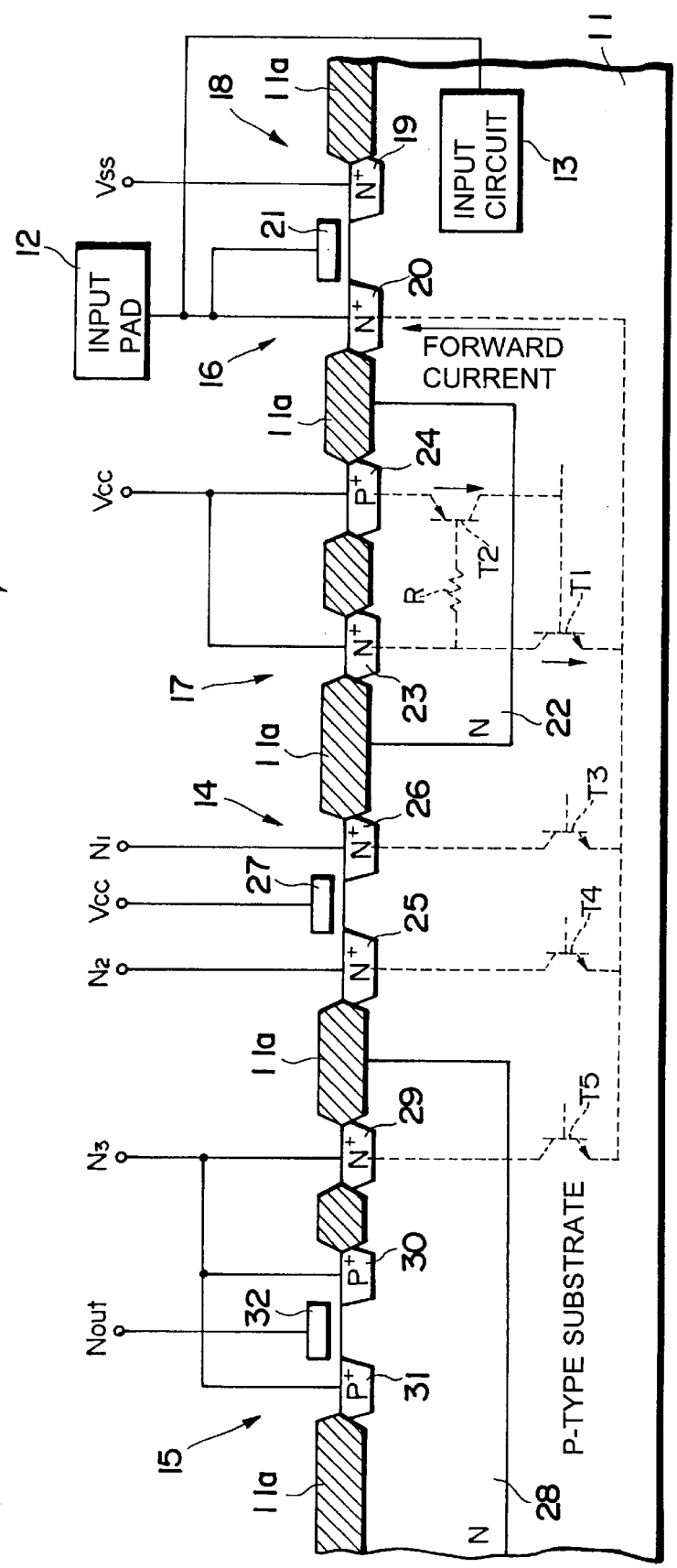
FIG. 1 is a schematic partial view in cross section of a first embodiment of the semiconductor device according to the present invention.

The present invention will be described with reference to embodiments shown in the accompanying drawings. However, the present invention is not limited to the following embodiments but may be implemented in various types. The preferred embodiments are only provided to make the disclosure of the invention complete and make one having an ordinary skill in the art know the scope of the invention. The thicknesses of various layers and regions are emphasized for clarity in accompanying drawings. Also, when a layer is defined to exist on another layer or a substrate, the layer may exist directly on another layer or substrate, or an interlayer layer may be present therebetween. Throughout the drawings, the same reference numerals denote the same elements.

[First Embodiment]

FIG. 1 is a sectional view of a first embodiment of the semiconductor device according to the present invention.

In an example, shown in FIG. 1, of a semiconductor device 10 according to the present invention, as the semiconductor substrate 11, a p-type semiconductor substrate of p-type conductivity is used at the ground potential.

In the semiconductor substrate 11, an input circuit 13 to receive a signal input from an input pad 12 is fabricated as a portion of the internal circuit, and a plurality of circuit parts, such MOS transistors, for example, are fabricated as other portions of the internal circuits.

Also, in the semiconductor substrate 11, a protection circuit 16 is provided to prevent the flow of an overcurrent into the input circuit 13, such as a surge current caused by static electricity acting on the input pad 12, and furthermore a guard ring 17 is fabricated to prevent a leak current from the protection circuit 16 from flowing into the internal circuits, such as the MOS transistors.

The protection circuit 16 is formed of a well-known MOS transistor 18, and the MOS transistor 18 is fabricated in an active region partitioned by a field oxide film 11a on the semiconductor substrate 11.

In the example shown in FIG. 1, the MOS transistor 18 is an n-channel MOS transistor having a source 19 and a drain 20 formed by a pair of n-type doped regions different in conductivity type from the semiconductor substrate 11, in addition to a gate 21. A ground potential (Vss) line is connected to the source 19. The drain 20 and the gate 21 are connected to the input pad 12, which is connected to the input circuit 13.

This protection circuit 16, as has been widely known, keeps in the nonconducting state the channel between the source 19 and the drain 20 of the MOS transistor 18 to ordinary current signals input to the input pad 12.

Therefore, a signal input to the input pad 12 is input appropriately into the input circuit 13.

On the other hand, when a overcurrent, such as a surge current, is input to the input pad 12, a gate voltage 21 is applied to the gate, the MOS transistor forms the channel between the source 19 and the drain 20, so that a greater part of the overcurrent is guided from the drain 20 to the ground potential (Vss) line.

Consequently, the flow of the overcurrent into the input circuit 13 is blocked, thus protecting the input circuit 13 from the overcurrent.

When the MOS transistor 18 of the protection circuit 16 forms the channel between the source 19 and the drain 20, if the carriers passing through the channel flow in the semiconductor substrate 11 and move to other circuit portions, such as the MOS transistors 14 and 15, for example, those circuit portions are affected by a resulting current.

The guard ring 17 is formed between the protection circuit 16 and the internal circuit portions (14 and 15) in order to prevent the effects of the leak current by the carriers from the protection circuit 16.

The guard ring 17 comprises a well region 22 of n-type conductivity in the substrate 11 of p-type conductivity, and a pair of heavily doped impurity regions 23 and 24 formed in the well region 22.

Of the pair of heavily doped impurity regions, one heavily doped impurity region 23 is of the same conductivity type as the well region 22, while the other heavily doped impurity region 24 is of p-type conductivity opposite to the conductivity type of the well region 22. The two heavily impurity doped regions 23 and 24 are connected to the power supply voltage (Vcc) line.

The one heavily impurity doped region 23 of the guard ring 17 is of n-type, the semiconductor substrate is of p-type, and the drain 20 of the protective type 16 is of n type. Therefore, the regions 23, 11 and 20 constitute a first parasitic NPN transistor T1, respectively serving as the collector, the base and the emitter.

The other heavily doped impurity region 24 of the guard ring 17 is of p-type, the well region 22 is of n-type, and the semiconductor substrate 11 is of p-type, so that those regions 24, constitute a second parasitic PNP transistor T2 as those regions respectively serve as the emitter, the base and the collector.

The collector of the first parasitic NPN transistor T1 is connected to the base of the second parasitic PNP transistor T2. With respect to the forward currents of the two parasitic transistors T1 and T2, a parasitic resistance due to the resistance of the well region 22 is formed between the collector of the first parasitic NPN transistor T1 and the base of the second parasitic PNP transistor T2.

Because the semiconductor substrate 11 is at the ground potential Vss and the input signal to the input pad 12 is normally at a positive potential, those parasitic transistors T1 and T2 do not operate.

The guard ring 17, like in the prior art, absorbs a leak current by the leakage of carriers from the protection circuit 16 through the well region 22 to which the power supply voltage Vcc is applied.

The MOS transistor 14 cited as an example of the internal circuits protected by the guard ring is an n-channel MOS transistor having as drain and source a pair of impurity doped regions 25 and 26 of n-type conductivity opposite to the conductivity type of the semiconductor substrate 11. The impurity doped regions 25 and 26 are connected to nodes N1 and N2 of the circuit to be described later, and have positive potentials applied respectively, and the power supply voltage (Vcc) line is connected to a gate 27.

The other MOS transistor 15 mentioned as an example of the internal circuits is a p-channel MOS capacitor having a heavily doped impurity n-type region 29, and a pair of heavily doped impurity p-type regions 30 and 31 fabricated in the n-type well region 28, and the impurity doped regions 29 and 30 are connected to node N3 of the circuit to be described later, and are at positive potentials. A gate 32 of the MOS capacitor 15 is used as the output terminal Nout.

Of the components of the internal circuits 14 and 15, the impurity doped regions 25, 26 and 29 of the conductivity type opposite to the conductivity type of the semiconductor substrate 11 have positive potentials applied respectively, like the impurity doped region 23 of the guard ring 17 does. Like the first parasitic NPN transistor T1, the parasitic transistors T3 to T5 are formed respectively by using the impurity doped region 25, 26, or 29 as the collector, the semiconductor substrate 11 as the base, and the drain 20 of the protection circuit 16 as the emitter.

As described above, those parasitic transistors T3 to T5 do not operate just as the parasitic transistors T1 and T2 so long as the input signal to the input pad 12 is at a positive potential. Owing to the absorption of the carriers by the guard ring 17, the internal circuits (14 and 15) including the parasitic transistors T3 to T5 are free from the effects of the leak current from the protection circuit 16.

However, when, for example, by the flow of a surge current to the input pad 12, the drain 20 is made lower (negative) than the ground potential Vss of the semiconductor substrate 11, the base potential of the parasitic transistors T1, T3 to T5 becomes higher than the emitter potential, the parasitic transistors T1, T3 to T5 conduct.

When the first parasitic NPN transistor T1 conducts, by a voltage drop at the parasitic resistance R, the base potential of the second parasitic PNP transistor T2 goes down, and therefore by a potential difference between the emitter and the base of thereof, the parasitic transistor T2 conducts.

By the conduction of the second parasitic PNP transistor T2, a forward current flows from the power supply voltage (Vcc) line applied to the heavily doped impurity region 24 to the drain 20, and by the forward current that flows through the semiconductor substrate 11, and the potential of the drain 20 rises to the potential of the semiconductor substrate 11.

Consequently, the inverted potential difference between the potential of the drain 20 and the potential of the semiconductor substrate 11, which caused the respective parasitic transistors T1 to T5 to operate, is eliminated, thus putting the parasitic transistors T1 to T5 into the off state.

Thus, by turning off the parasitic transistors T1 to T5 instantaneously, the actions of the parasitic transistors can be repressed substantially and effectively.

Figure 2:
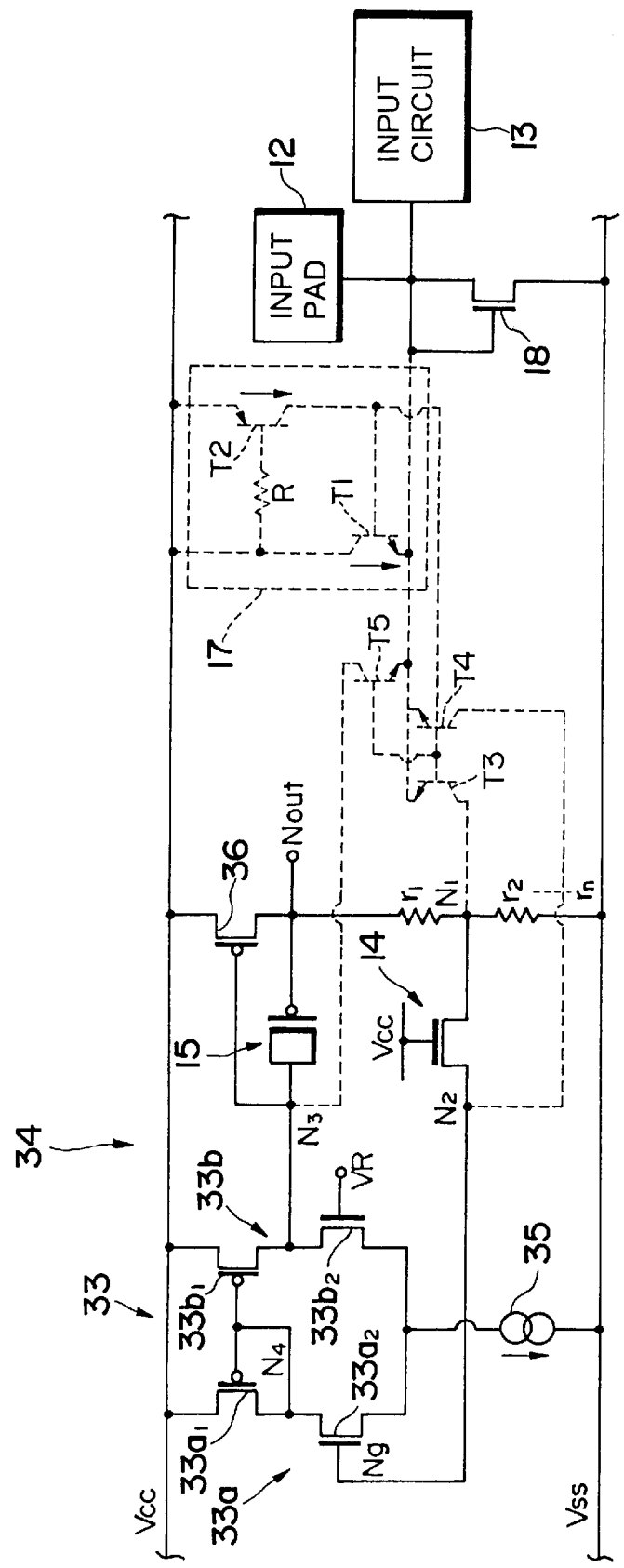
FIG. 2 is a circuit diagram of the first embodiment of the present invention.

FIG. 2 is a circuit diagram of a first embodiment shown in Fig. 1. FIG. 1 shows an example of the internal circuits including the MOS transistors 14 and 15 shown as illustrative examples of the internal circuits. FIG. 2 shows the protection circuit 16 formed by a MOS transistor 18 and designed to prevent an overcurrent from flowing into the input circuit 13 through the input pad as depicted in FIG. 1. FIG. 2 also shows the guard ring 17 including a first parasitic NPN transistor T1, a second parasitic PNP transistor T2, and a parasitic resistance R. The portion of the circuit which includes the MOS transistors 14 and 15 is a well-known constant-voltage regulated power supply circuit 34 using a differential amplifier 33 comprising a pair of CMOS's 33a and 33b.

The differential amplifier 33 is inserted between the power supply voltage (Vcc) and the ground potential (Vss) and is connected to the ground potential (Vss) line through the intermediary of a well-known current limiter 35 for preventing a through current. The differential amplifier 33 operates to output a constant voltage from the output terminal Nout of node N3 according to a difference between the voltage of the reference voltage input terminal VR and the voltage of the input gate Ng connected to node N2. To smooth out this output voltage, the above-mentioned p-channel MOS capacitor 15 is inserted between node N3 and the output terminal Nout.

A p-channel MOS transistor 36 to function as a variable resistance is connected between the power supply voltage (Vcc) line and the output terminal Nout.

The MOS transistor 14 is shown as a representative one of many MOS transistors functioning as selector switches to obtain desired voltages from voltage-dividing resistance circuits r1 through rn inserted, together with a MOS transistor 35 serving as a variable resistance, between the power supply voltage (Vcc) line and the ground potential (Vss).

An appropriate divided voltage is selected between the power supply voltage (Vcc) and the ground potential (Vss) line by a selector switch formed by a MOS transistor 14, and when the selected voltage is applied to the input gate Ng of the differential amplifier 33, an appropriate voltage is output from the output terminal Nout.

In the constant-voltage regulated power supply circuit 34, as is well known, for example, when the voltage of the output terminal Nout falls, the node voltage N2 from one of the voltage-dividing resistance circuits r1 through rn goes down, and therefore the voltage of the input gate Ng drops. By the voltage drop at the input gate Ng, the resistance of the MOS transistor 33a2 increases, and accordingly the potential at node N4 between the MOS transistor 33a1 and the MOS transistor 33b1 rises.

Due to the rise of the potential at node N4, the resistance of the p-channel MOS transistor increases, and according to the increase of this resistance, the potential at node N3 drops. By the drop in the potential at node N3, the resistance of the p-channel MOS transistor decreases, for which reason the potential at the output terminal Nout rises. Thus, the above-mentioned voltage drop at the output terminal Nout is corrected.

By the well-known differential action, the constant-voltage regulated power supply circuit, supplies a current at constant voltage to the other internal circuits from its output terminal Nout.

In the constant-voltage regulated power supply circuit 34, when the parasitic transistors T3 to T5 operate and come into the conducting state, the voltages at nodes N1 to N3 drop, the above-mentioned voltage control operation becomes unstable.

According to the present invention, however, since the parasitic transistor actions can be repressed effectively as described above, the operation of the constant-voltage regulated power supply circuit 34 can be stabilized.

[Second Embodiment]

Figure 3:
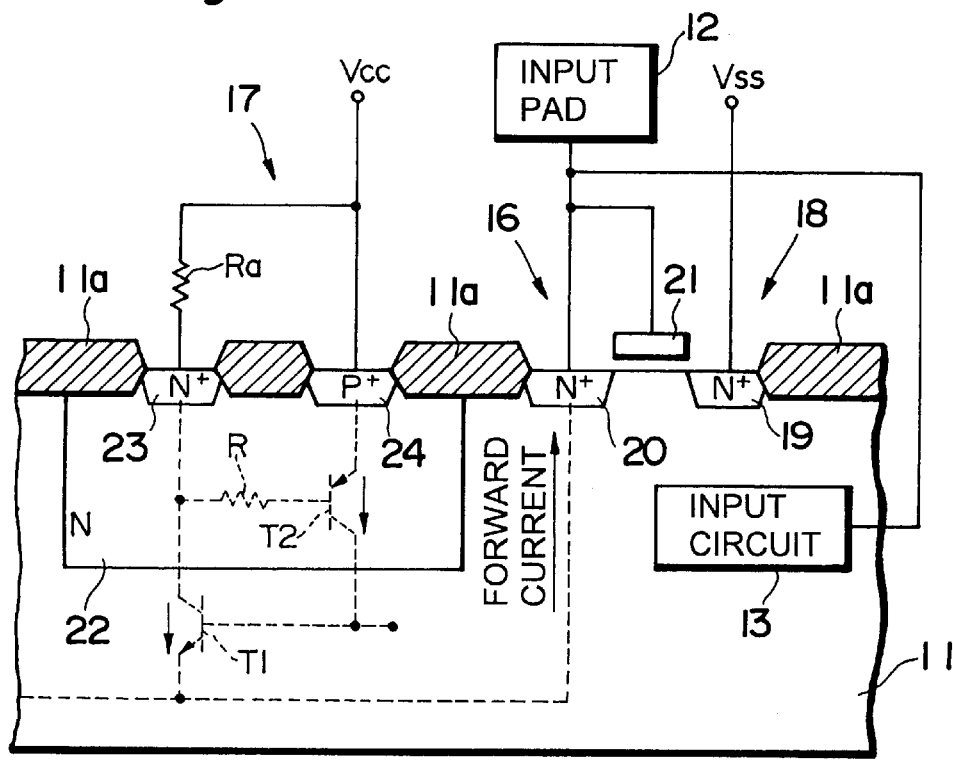
FIG. 3 is a sectional view of a second embodiment of the semiconductor device according to the present invention.
Figure 4:
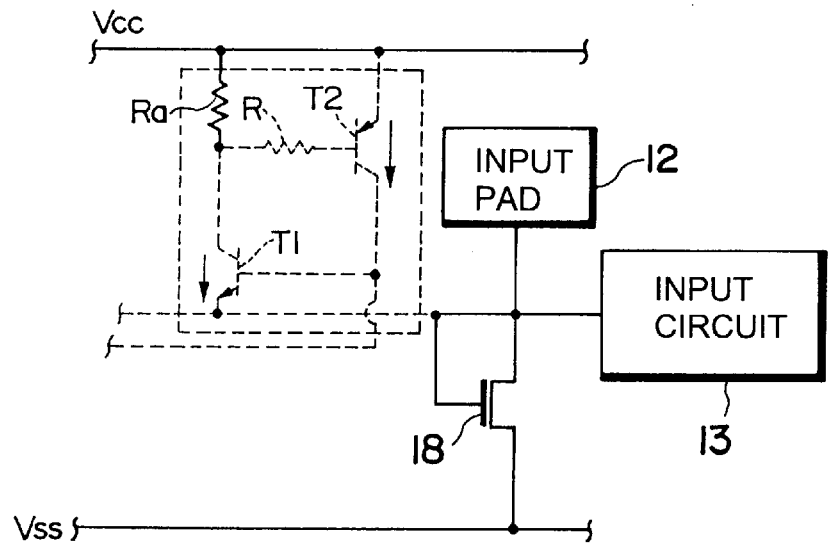
FIG. 4 is a circuit diagram of the second embodiment of the present invention.

FIGS. 3 and 4 are a sectional view and a circuit diagram of a second embodiment of the semiconductor device according to the present invention.

In the second embodiment, as shown in FIG. 3, the heavily impurity doped region 24 of the guard ring 17 is directly connected to the power supply voltage (Vcc) line, while the heavily doped impurity region 23 is connected to the power supply voltage (Vcc) line through the intermediary of a resistance Ra.

As is clear from FIG. 4, when a collector current flows to the first parasitic NPN transistor T1, this resistance Ra, through IRa voltage drop, markedly reduces the base potential of the second parasitic PNP transistor T2.

Therefore, this ensures the conduction of the second parasitic PNP transistor T2 resulting from the conduction of the first parasitic NPN transistor T1, in other words, makes the parasitic PNP transistor T2 to operate securely.

In the first and the second embodiments, the circuits are shown in which with regard to a pair of heavily doped impurity regions 23 and 24 formed in the well region 22 of the guard ring 17, the doped impurity region 24, which is opposite in conductivity type to the drain 20 of the MOS transistor 18 of the protection circuit 16, is arranged closer to the drain 20 that the other doped impurity region 23. But, the n-type doped impurity region 23 may be arranged closer to the n-type drain 20 than the p-type doped impurity region 24.

Nevertheless, the arrangement in the described embodiments is preferable for the secure current injection into the drain 20 by the action of the second parasitic PNP transistor T2 and the steady stop action of the parasitic transistors T3 to T5 by the action of the parasitic PNP transistor T2.

In the foregoing, description has been made of embodiments using the p-type semiconductor substrate, but the present invention may be applied to an n-type semiconductor substrate.

When an n-type semiconductor substrate is used, a p-channel MOS is adopted for the MOS transistor of the protection circuit, a PNP transistor is used for the first parasitic transistor, and an NPN transistor is used for the second parasitic transistor. In this case, the above-mentioned resistance Ra is connected to the p-type high concentration impurity region of the first parasitic PNP transistor.

In the semiconductor device according to the present invention, when the first parasitic transistor, formed in relation to the guard ring, and the parasitic transistors of the same kind as the first parasitic transistor, formed in circuit locations other than the guard ring, conduct, the second parasitic transistor conducts, and by the conduction of the second parasitic transistor, it is possible to correct a change of the drain potential of the MOS transistor of the protection circuit, which causes the first parasitic transistor and the parasitic transistors of the same kind as the first parasitic transistor to conduct.

Therefore, according to the present invention, by conduction of the first parasitic transistor, the second parasitic transistor can be made to conduct, and by the conduction of the second parasitic transistor, the first parasitic transistor and the other parasitic transistors of the same kind as the first parasitic transistors can be turned off. Thus, the protection circuit and the guard ring can exhibit their functions without incurring adverse effects by the conduction of the parasitic transistors.

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the invention would be of significant utility without undue experimentation.

What is claimed is:

1. A semiconductor device comprising:
  a semiconductor substrate of either an n-type or a p-type conductivity having formed therein an internal circuit which receives an input signal through an input pad, said internal circuit having a plurality of parasitic transistors which are connected to each other in parallel;
  a protection circuit including a MOS transistor having a source and a drain and formed in said semiconductor substrate to protect said internal circuit from a surge current applied to said input pad; and
  a guard ring, formed between said MOS transistor of said semiconductor substrate and said internal circuit, to cut off a leak current from said MOS transistor to said internal circuit, said guard ring including a well region having a conductivity type opposite to the conductivity type of said semiconductor substrate, and a pair of heavily doped impurity regions formed spaced apart from each other on the surface of said well region, having mutually different conductivity types, and having substantially equal voltages applied to have potentials with respect to the source of said MOS transistor, wherein there are formed a first parasitic transistor having a first region of said heavily doped impurity regions as the collector, said semiconductor substrate as the base, and the drain region of said MOS transistor as the emitter, said first region being identical in conductivity type with the well region and being located in said well region; and a second parasitic transistor having a second region of said heavily doped impurity regions in said well region as the emitter, the well region as the base, and said semiconductor substrate as the collector, said first parasitic transistor being connected in parallel to each of said parasitic transistors in said internal circuit and wherein the base and the collector of said first parasitic transistor are connected to the collector and the base of said second parasitic transistor respectively.

2. A semiconductor device according to claim 1, wherein of said pair of heavily doped impurity regions of said guard ring, the heavily doped impurity region opposite in conductivity type to said drain of said MOS transistor is arranged closer to said drain than the heavily doped impurity region of the other conductivity type.

3. A semiconductor device according to claim 1, wherein said pair of heavily doped impurity regions of said guard ring are connected to a power supply line and the first region identical in conductivity type with said well region is connected to said power supply line through the intermediary of a resistance.

4. A semiconductor device comprising:
a semiconductor substrate of either an n-type or a p-type conductivity having formed therein an internal circuit which receives an input signal through an input pad, said internal circuit having a plurality of parasitic transistors which are connected to each other in parallel;

a protection circuit including a MOS transistor having a source and a drain and formed in said semiconductor substrate to protect said internal circuit from a surge current applied to said input pad; and a guard ring mechanism, formed between said MOS transistor of said semiconductor substrate and said internal circuit, to cut off a leak current from said MOS transistor to said internal circuit, said guard ring mechanism including a well region having a conductivity type opposite to the conductivity type of said semiconductor substrate, and a pair of heavily doped impurity regions formed spaced apart from each other on the surface of said well region, having mutually different conductivity types, and having substantially equal voltages applied to have potentials with respect to the source of said MOS transistor, wherein there are formed a first parasitic transistor having a first region of said heavily doped impurity regions as the collector, said semiconductor substrate as the base, and the drain region of said MOS transistor as the emitter, said first region being identical in conductivity type with the well region and being located in said well region; and a second parasitic transistor having a second region of said heavily doped impurity regions in said well region as the emitter, the well region as the base, and said semiconductor substrate as the collector, said first parasitic transistor being connected in parallel to each of said parasitic transistors in said internal circuit, and wherein the base and the collector of said first parasitic transistor are connected to the collector and the base of said second parasitic transistor respectively, and wherein conduction of said first parasitic transistor and said parasitic transistors in said internal circuit turns on said second parasitic transistor and then conduction of said second parasitic transistor turns off said first parasitic transistor and said parasitic transistors in said internal circuit.

5. A semiconductor device according to claim 4, wherein, of said pair of heavily doped impurity regions of said guard ring mechanism, the heavily doped impurity region opposite in conductivity type to said drain of said MOS transistor is arranged closer to said drain than the heavily doped impurity region of the other conductivity type.

6. A semiconductor device according to claim 4, wherein said pair of heavily doped impurity regions of said guard ring mechanism are connected to a power supply line and the first region identical in conductivity type with said well region is connected to said power supply line through the intermediary of a resistance.

* * * * *